United States Patent
Kolchin et al.

(10) Patent No.: US 11,999,261 B2
(45) Date of Patent: Jun. 4, 2024

(54) METHOD AND SYSTEM FOR MONITORING A BATTERY STATE UTILIZING A BATTERY TWIN

(71) Applicant: Siemens Aktiengesellschaft, Munich (DE)

(72) Inventors: Ivan Kolchin, Leningradskaya Oblast (RU); Holger Wolfschmidt, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 361 days.

(21) Appl. No.: 17/424,709

(22) PCT Filed: Jan. 24, 2019

(86) PCT No.: PCT/RU2019/000042
§ 371 (c)(1),
(2) Date: Jul. 21, 2021

(87) PCT Pub. No.: WO2020/153866
PCT Pub. Date: Jul. 30, 2020

(65) Prior Publication Data
US 2022/0080856 A1   Mar. 17, 2022

(51) Int. Cl.
*B60L 58/18* (2019.01)
*G01R 31/367* (2019.01)
(Continued)

(52) U.S. Cl.
CPC ............ *B60L 58/18* (2019.02); *G01R 31/367* (2019.01); *G01R 31/386* (2019.01); *G01R 31/396* (2019.01); *G01R 31/392* (2019.01)

(58) Field of Classification Search
CPC ....... B60L 58/18; G01R 31/396; G01R 1/386; G01R 31/367
See application file for complete search history.

(56) References Cited

U.S. PATENT DOCUMENTS

| | | | |
|---|---|---|---|
| 5,821,756 A * | 10/1998 | McShane | G01R 31/389 324/427 |
| 7,315,789 B2 * | 1/2008 | Plett | G01R 31/3842 702/65 |

(Continued)

FOREIGN PATENT DOCUMENTS

| | | |
|---|---|---|
| CN | 1791804 | 6/2006 |
| CN | 102411128 | 4/2012 |

(Continued)

OTHER PUBLICATIONS

Ramachandran et al. "Recursive Estimation of Battery Pack Parameters in Electric Vehicles", 2018 IEEE International Conference on Computational Intelligence And Computing Research, pp. 1-7, Dec. 13, 2018.

(Continued)

*Primary Examiner* — Luis A Martinez Borrero
(74) *Attorney, Agent, or Firm* — Cozen O'Connor (57) ABSTRACT

A method for monitoring a battery state without interruption of functioning a battery system using a battery twin, wherein the battery system includes a plurality of interconnected battery cells, and wherein the battery twin includes a battery twin cell that is identical to one battery cell of the battery system, where the method includes measuring a parameter of the battery cell that describes working conditions of either the battery cell and/or the entire battery system, where the method includes an offline measurement part that includes reproduction of the working conditions described with the measured parameter on the battery twin, such that while the battery twin operate under the reproduced working conditions, at least one further parameter of the battery twin is measured, and after the offline measurement part, the method further includes judging the battery state based on (Continued)

the measured at least one further parameter of the battery twin.

11 Claims, 4 Drawing Sheets

(51) Int. Cl.
*G01R 31/385* (2019.01)
*G01R 31/392* (2019.01)
*G01R 31/396* (2019.01)

(56) References Cited

U.S. PATENT DOCUMENTS

| | | | | |
|---|---|---|---|---|
| 7,582,387 B2* | 9/2009 | Howard | ............... | H01M 4/131 |
| | | | | 429/231.95 |
| 9,222,986 B2* | 12/2015 | Shen | ............... | G01R 31/382 |
| 9,395,419 B2* | 7/2016 | Park | ............... | G01R 31/392 |
| 9,523,741 B2* | 12/2016 | Most | ............... | G01R 31/385 |
| 9,625,532 B2* | 4/2017 | Gering | ............... | G01R 31/392 |
| 9,714,984 B2* | 7/2017 | Kim | ............... | G01R 31/392 |
| 10,006,967 B2* | 6/2018 | Ganesan | ............... | G01R 31/3646 |
| 10,073,858 B2* | 9/2018 | Baranowsky | ............... | G06F 11/3433 |
| 11,029,363 B2* | 6/2021 | Um | ............... | G01R 31/392 |
| 11,072,246 B2* | 7/2021 | Murbach | ............... | B60L 3/12 |
| 11,740,290 B2* | 8/2023 | Liaw | ............... | G01R 31/392 |
| | | | | 429/90 |
| 2006/0186890 A1* | 8/2006 | Iwane | ............... | G01R 31/392 |
| | | | | 324/426 |
| 2006/0284619 A1* | 12/2006 | Quint | ............... | G01R 31/3648 |
| | | | | 324/433 |
| 2008/0177345 A1* | 7/2008 | Schmidt | ............... | A61N 1/3708 |
| | | | | 607/30 |
| 2008/0315839 A1* | 12/2008 | Hermann | ............... | G01J 5/0096 |
| | | | | 320/136 |
| 2009/0037145 A1* | 2/2009 | Suzuki | ............... | G01R 31/392 |
| | | | | 702/183 |
| 2009/0106970 A1* | 4/2009 | Fan | ............... | H01M 10/0525 |
| | | | | 320/155 |
| 2011/0054816 A1* | 3/2011 | Prada | ............... | G01R 31/367 |
| | | | | 702/63 |
| 2011/0060565 A1* | 3/2011 | Sciarretta | ............... | H01M 10/4285 |
| | | | | 703/2 |
| 2011/0077880 A1* | 3/2011 | Gering | ............... | G01R 31/392 |
| | | | | 703/13 |
| 2011/0148424 A1* | 6/2011 | Chiang | ............... | G01R 31/3842 |
| | | | | 324/427 |
| 2011/0264381 A1* | 10/2011 | Gering | ............... | H01M 10/48 |
| | | | | 702/32 |
| 2011/0288797 A1* | 11/2011 | Schmidt | ............... | H01M 10/0525 |
| | | | | 702/63 |
| 2011/0301931 A1* | 12/2011 | Gering | ............... | G01R 31/392 |
| | | | | 703/13 |
| 2012/0105069 A1* | 5/2012 | Wang | ............... | G01R 31/392 |
| | | | | 324/427 |
| 2012/0274140 A1* | 11/2012 | Ganor | ............... | H01M 10/0445 |
| | | | | 307/71 |
| 2013/0090900 A1* | 4/2013 | Gering | ............... | G01R 31/392 |
| | | | | 703/2 |
| 2015/0115970 A1* | 4/2015 | Most | ............... | G01R 31/385 |
| | | | | 324/427 |
| 2015/0260795 A1* | 9/2015 | Vinit | ............... | G01R 31/392 |
| | | | | 324/426 |
| 2015/0323610 A1* | 11/2015 | Ahn | ............... | H01M 10/486 |
| | | | | 320/152 |
| 2016/0003917 A1* | 1/2016 | You | ............... | G01R 31/367 |
| | | | | 702/63 |
| 2017/0264987 A1* | 9/2017 | Hong | ............... | H04R 1/1091 |
| 2018/0024199 A1* | 1/2018 | Lee | ............... | G01R 31/3842 |
| | | | | 702/63 |
| 2018/0123185 A1* | 5/2018 | Kim | ............... | G01R 31/392 |
| 2018/0149708 A1* | 5/2018 | Shoa | ............... | G01R 31/392 |
| 2018/0188296 A1* | 7/2018 | Neumann | ............... | H02H 3/02 |
| 2019/0248252 A1* | 8/2019 | Jin | ............... | B60L 58/12 |
| 2021/0167619 A1* | 6/2021 | Kohn | ............... | H02J 7/0068 |

FOREIGN PATENT DOCUMENTS

| | | |
|---|---|---|
| CN | 203480000 U | 3/2014 |
| CN | 108544925 | 9/2018 |
| EP | 3379278 | 9/2018 |
| JP | 2010-223968 | 10/2010 |
| WO | 2018220115 | 12/2018 |

OTHER PUBLICATIONS

Gao et al., "Online Parametric Adaptive State of Charge Estimation for Lithium Batteries", 2017 Chinese Automation Congress (CAC), IEEE; pp. 1442-1447, Oct. 20, 2017.
PCT International Search Report dated Oct. 25, 2019 based on PCT/RU2019/000042 filed Jan. 24, 2019.

* cited by examiner

METHOD AND SYSTEM FOR MONITORING A BATTERY STATE UTILIZING A BATTERY TWIN

CROSS-REFERENCE TO RELATED APPLICATIONS

This is a U.S. national stage of application No. PCT/RU2019/000042 filed 24 Jan. 2019.

BACKGROUND OF THE INVENTION

1. Field of the Invention

The present invention generally relates to battery management to monitor a battery state without interrupting the functioning of the battery system.

2. Description of the Related Art

The use of electrochemical energy storage units is becoming more common, and they are subject to new requirements for increasing the uptime of electrical supply for power equipment. In some cases, battery systems, or batteries serve as the main electric power unit working under an electric load and on the electric drive of the vehicle.

Besides using them as storage in smart grids, electrocars and quadrocopters, batteries are planned to be used in critical-mission areas. For example, currently, companies are working on enabling passenger aircraft to fly with hybrid-electric propulsion systems. Sometimes, batteries work in remote places with limited access of service personnel. Additionally, end customers like to have batteries with low maintenance costs. Therefore, knowledge about the state and monitoring of the battery state of the battery system, for example, typically about state of charge (SOC), depth of discharge (DOD), state of health (SOH) or state of function (SOF)=, is crucial in this case. Consequently, there is a constant need for different methods and ways to continuously monitor batteries to guarantee uninterruptible operation.

One of the important indicators of battery state is state of health (SOH), which is a figure of merit of the condition of a battery (or a cell, or a battery pack/a battery system), compared to its original conditions. The units of SOH are percent points (100%=the battery's conditions match the battery's specifications). Typically, a battery's SOH is initialized as 100% at the time of manufacture and decreases over time and use.

Online and offline methods can be used for SOH estimation. Based on knowledge of the SOH of a given battery, it is possible to define whether the present battery conditions make it suitable for that particular application, and an estimate can be made of the battery's useful lifetime in that application.

Battery cell monitoring methods are usually categorized into two types—online and offline methods.

The online technique is about online measurement of voltage and current of the working battery cell and/or the working battery system to estimate battery parameters. It should be separately noted that the number of parameters of the battery system that can be measured while the battery system is in operation, is limited, in most cases to voltage and current. Typically, measurement of voltage and current are taken for the whole battery system and/or for a particular battery cell of the battery system and/or for a battery module that is a pack of several battery cells. Also measuring ambient environment parameters, for example, ambient temperature, and measuring the temperature of the particular battery cell of the battery system is available while the battery system is in operation condition.

Online monitoring of the battery state is mainly achieved via electrical battery circuit modeling and Kalman filtering. However, all kinds of online techniques tend to diverge from the true values. For example, coefficients of Kalman filters have to be manually attuned for each kinds of batteries. There is just no way how to automatize this process at present. Therefore, it is unlikely that such a solution is able to work stably for three or more years without interference.

Multiple approaches exist how to provide online monitoring battery cells in a battery system, and, typically, this function is included into functions of battery management systems (BMS), that are used to control operation of battery systems. In general, BMS performs a set of function such as protecting the battery systems from operating outside its safe operating area, monitoring its state, calculating secondary data, reporting that data, controlling its environment, authenticating and balancing as well.

Another category of battery monitoring methods is offline methods. Offline techniques are much more precise due to direct measurements of different parameters of each battery cell of the battery system and/or the entire battery system. Significantly more parameters are available for offline measuring while the battery system and/or the battery cell of the battery system are out of operation.

The basic disadvantage they have is that one or more battery cells of the battery system or the entire battery system must be disconnected for some time. That is why this approach is used in most cases, either in laboratory studies or during commissioning works.

Considering all of the above-mentioned problems, it should be noted that there is a need to monitor the battery state of a battery system that comprises a plurality of battery cells without interrupting the functioning of the battery system and to provide such battery system state monitoring with higher accuracy to achieve new level of efficiency for predictive maintenance.

SUMMARY OF THE INVENTION

Accordingly, it is an object of the present invention to provide a new way of monitoring a battery cell state and a battery system state without interrupting the functioning of the battery system.

This and other objects and advantages are achieved in accordance with the present invention by a method for monitoring a battery state without interrupting the functioning of a battery system using a battery twin, and by a system for monitoring a battery state without interrupting the functioning of a battery system utilizing a battery twin.

In an embodiment of the present invention, a method for monitoring a battery state without interrupting the functioning of a battery system using a battery twin is provided, where the battery system comprises a plurality of battery cells connected to each other, and where the battery twin comprises at least one battery twin cell that is identical to at least one of the battery cells of the battery system.

The method comprises measuring at least one parameter of the at least one battery cell of the battery system, where such measured at least one parameter describes the working conditions of the at least one battery cell and/or the battery system.

Further, the method comprises an offline measurement part, which comprises reproduction of the working conditions described with the measured at least one parameter on the battery twin. It should be performed such that the at least one parameter of the battery twin under the reproduced working conditions is equal to the measured at least one parameter of the at least one battery cell of the battery system. After that, while the battery twin is operating under the reproduced working conditions, at least one further parameter of the battery twin is measured. Such further parameters of the battery twin are measured without interrupting the functioning of the battery system.

After the offline measurement part, the method further comprises making a judgment about the battery state based on the measured at least one further parameter of the battery twin. This judgement about the battery state can be made of the at least one battery cell and/or the entire battery system.

it is also an object of the invention to provide a system for monitoring a battery state without interrupting the functioning of a battery system using a battery twin, where the battery system comprises a plurality of interconnected battery cells.

The system comprises at least one battery twin, where the battery twin comprises at least one battery twin cell that is identical to at least one of the battery cells of the battery system.

The system also comprises a measurement device that is configured to measure at least one parameter of the at least one battery cell of the battery system without interrupting the functioning of the battery system, where the at least one parameter describes the working conditions of the battery system, a further measurement device that is configured to measure at least one further parameter of the battery twin, where the at least one further parameter describes a state of the battery twin and a control unit that is configured to implement the method for monitoring the battery state without interrupting the functioning of a battery system using the battery twin.

The method and the system may be used to monitor a battery state of one battery cell of the battery system or to monitor the battery state of plurality battery cells of the battery system or to monitor the entire battery system. The monitoring of the battery state is accomplished without interrupting the functioning of the battery system.

Hereinafter "online measurements" means that the measurements of parameters are fulfilled for the battery system and/or for the at least one battery cell while the at least one battery cell is connected to the battery system and the battery system is operating and/or functioning.

Hereinafter "offline measurements" means that the measurements of further parameters are fulfilled for the battery twin while the battery system is operating and/or functioning, where these offline measurements do not affect the functioning the battery system.

The present invention is based on the general insight that it is possible to make judgements about the battery state of the battery system based on the knowledge of the battery state of the battery twin that is under the same working conditions as the battery system.

In addition, online and offline measuring techniques have their advantages and disadvantages. More parameters for offline measurements to monitor the battery state are available, while within online measurements it is possible to measure parameters that describe working conditions under which the battery system and/or the battery cell of the battery system operates.

Reproducing the working conditions in which the battery system works into the battery twin and considering similarity of the battery twin to the at least one battery cell of the battery system and similarity of the battery cells to each other within the battery system, it is assumed that the battery state of the battery twin and the battery state of the battery cell will be the same. Therefore, defining precisely the battery state of the battery twin makes possible to define precisely the battery state of the battery cell and/or battery system.

In accordance with an embodiment of the present invention, in accordance with the method for monitoring a battery state without interrupting functioning the battery system using the battery twin, the method allows the estimation of an actual battery state of the at least one battery cell and/or the battery system in online mode/regime with further adjustment of the battery state based on offline measurements of the further parameter of the battery twin.

The measurements of the at least one parameter of the at least one battery cell of the battery system can be used not only as data that contains information about the working conditions the battery cell and/or the battery system works, but also to estimate the battery state of the battery cell and/or the battery system. Therefore, having such an at least one measured parameter it is possible to estimate the actual battery state of the battery cell and/or the battery system. However, such estimation is not precise because of the nature of parameters available for the online measurements. On the other hand, the battery twin can be used as a source of additional information (i.e., coefficients that are required for battery state calculation) to adjust the actual battery state.

With a given time interval, it is possible to accomplish the offline measurement part of the method, which includes reproduction of the working conditions on the battery twin and measurement of at least one further parameter of the battery twin.

Therefore, the actual battery state of the battery cell and/or the battery system is adjusted based on the at least one further parameter of the battery twin measured within the offline measurement part, where the offline measurement part is accomplished with the given time interval.

This feature allows use of the battery twin to monitor the battery state of different battery systems.

However, in case if within some period of time the battery twin is in different working conditions in comparison with the battery system, further it will be possible to make judgments and estimation of the battery state of the battery system over the battery twin in relative numbers (for example, estimate how quickly the battery system "gets old", how quickly the state of the health decreases).

Usually measurement devices used for precise offline measurement is very sophisticated and very expensive. Therefore, it is sometimes reasonable to use the battery twin and such sophisticated devices for offline measurements for a plurality of battery systems.

This feature allows an increased accuracy of the estimation of the battery state by using the battery twin.

In another possible embodiment of the method, between measuring at least one parameter and the offline measurement part the method comprises transferring data that comprise an information about the measured at least one parameter to the battery twin to reproduce the working conditions described with the measured at least one parameter on the battery twin.

Such data transfer can be performed by different ways and data communication protocols, such as by transferring data through Internet, Ethernet, Wi-Fi, etc. Different ways of data transferring can be also combined with each other.

Such a transfer of data that comprise information about the measured at least one parameter from the battery system to the battery twin can be accomplished through a cloud application.

This feature allows storing data in the cloud, running analytics, giving access to different types of users to manage the data and the infrastructure in the cloud. In general, it is possible to create an ecosystem, i.e., a set of services and applications, related to the battery state estimation of batteries distributed across the world.

In some cases, it is possible to couple the battery twin to the battery system, for example to couple electrically, i.e., to establish a coupling bypass, and to transfer data through such coupling bypass. The coupling bypass is suited for transferring analogous signal.

Therefore, such feature allows the precise transfer of information about the changes of the at least one parameter. In cases of an electrical coupling bypass, for example, a portion of the current from the battery system can be transferred to the battery twin. Despite the fact that only a small portion of the current is transferred through electrical coupling bypass and despite the fact that the such current should be additionally amplified to reproduce working conditions of the battery system on to the battery twin, the current profile is still reproduced on the battery twin with a high level of accuracy.

This feature allows the reproduction of the working conditions on the battery twin with a high level of accuracy. Therefore, the accuracy of the monitoring of the battery state also increases.

In another embodiment of the method, the battery twin is fully identical to the battery system.

Having such a battery twin, which is placed in the exact working conditions as the battery system, allows the battery state of the battery system to be monitored with a high level of accuracy by using offline measurements with the sophisticated measurement devices accomplished on the battery twin.

In an embodiment of the system in accordance with the present invention, the battery system and the battery twin are coupled to each other such that analogous signals from the battery system are transferred to the battery twin directly.

Such a feature allows information about the changes of the at least one parameter to be precisely transferred. In the case of an electrical coupling bypass, for example, a portion of the current from the battery system can be transferred to the battery twin. Despite=the fact that only a small portion of the current is transferred through electrical coupling bypass and despite the fact that such a current should be additionally amplified to reproduce working conditions of the battery system on to the battery twin, the current profile is still reproduced on the battery twin with a high level of accuracy.

In another embodiment of the system in accordance with the present invention, the battery system and the battery twin are located such that ambient working conditions are shared. Such a feature can be realized, for example, if the battery twin is located close to the battery system. For example, the battery twin can be located in the same room where the battery system is functioning.

This feature allows placement of the battery twin in the same ambient working conditions (i.e., provide the same, for example, ambient temperature, ambient humidity, and/or vibration) without involving additional equipment.

Other objects and features of the present invention will become apparent from the following detailed description considered in conjunction with the accompanying drawings.

It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For more complete understanding of the present invention and advantages thereof, reference is now made to the following description taken in accompanying drawings. The invention is explained in more details below using exemplary embodiments which are specified in the schematic figures of the drawings, in which.

DETAILED DESCRIPTION OF THE EXEMPLARY EMBODIMENTS

Various embodiments are described with reference to the drawings, where like reference numerals are used to refer to like elements throughout. In the following description, for purpose of explanation, numerous specific details are set forth in order to provide a thorough understanding of one or more embodiments. It may be noted that the illustrated embodiments are intended to explain, and not to limit the invention. It may be evident that such embodiments may be practiced without these specific details.

Figure 1:
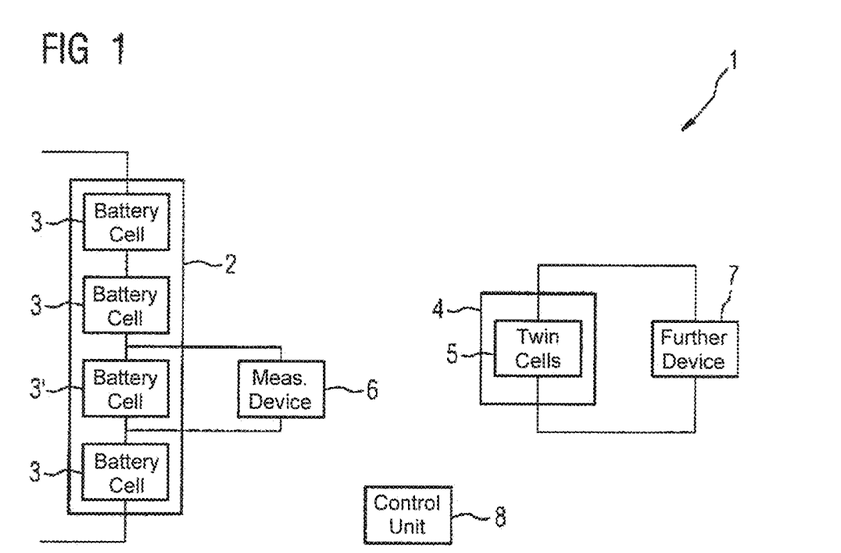
FIG. 1 schematically illustrates a system for monitoring a battery state without interrupting the functioning of a battery system using a battery twin in accordance with the present invention.

FIG. 1 illustrates a system 1 for monitoring a battery state without interrupting the functioning of the battery system 2 using a battery twin 4.

The battery system 2 comprises a plurality of interconnected battery cells 3, 3'. The plurality of the interconnected battery cells 3 of the battery system 2 can be in series and/or in parallel circuits.

The system 1 comprises a battery twin 4, where the battery twin 4 comprises at least one battery twin cell 5 that is identical to at least battery cell one of the battery cells 3, 3' of the battery system 2.

The battery twin 4 can comprise a plurality of the battery twin cells 5. In an ideal case, all battery twin cells 5 should be identical to the battery cells 3, 3' of the battery system 2.

In fact, the battery twin 4 can comprise the same number of the battery twin cells 5 as the number of the battery cells 3, 3' in the battery system 2. In the ideal case, the battery twin 4 is fully identical to the battery system 2.

Additionally, the system 1 comprises a measurement device 6 that measures at least one parameter of the at least one battery cell 3' of the battery system 2 without interrupting the functioning of the battery system 2. The at least one parameter of the at least one battery cell 3, 3', or the plurality of battery cells 3, 3', or even of the entire battery system 2 can be also measured by the measurement device 6 without interrupting the functioning of the battery system 2. Such measurement devices 6 are well known. There are different types of such devices, such as a sensor, a voltmeter, an amperemeter, a thermometer, and/or any combination of such devices.

Typically, current and voltage are the parameters that are rather easily measured without interrupting the functioning of the battery system 2. Additionally, such measurements do not require expensive and sophisticated measurement devices 6.

In addition, such environmental parameters as ambient temperature, humidity, pressure, or vibration can be easily measured without any interruption of functioning of the battery system 2.

The measurement device 6 can be adopted to measure one or more parameters that describe the working conditions in which the battery system 2 operates.

What parameters should be measured and how many parameters should be measured by the measurement device 6 is defined by experts and depends on what state of the battery system should be monitored.

Additionally, the system 1 comprises a further measurement device 7 that measures at least one further parameter of the battery twin 4. Such further measurement devices 7 are well known. The further measurement device 7 is equipment that typically used in laboratories for sophisticated and precise measurements. There are different types of such devices, e.g., a sensor, a voltmeter, an amperemeter, a function generator, or a thermometer, and/or any combination of such devices.

One or more further parameters of the battery twin 4 can be measured by the further measurement device 7. What to further parameters should be measured and how many further parameters should be measured is defined by experts and depends on what state of the battery system 2 should be monitored. Typically, such further parameters are impedance, internal resistance, and/or total capacity. Typically, the following measurement methods are used in laboratories for precise measurement of battery parameters: DC load method, AC conductance (1 kHz-method), electrochemical impedance spectroscopy.

In accordance with the present invention, the system 1 further comprises a control unit 8 that is configured to implement the method 100 for monitoring a battery state without interrupting the functioning of a battery system using a battery twin in accordance with the invention. The method 100 for monitoring a battery state without interrupting the functioning of a battery system using a battery twin in accordance with the invention is described below.

In accordance with an embodiment of the present invention, the battery system 2 and the battery twin 4 can be coupled to each other, for example, electrically, such analogous signals are transferred from the battery system 2 to the battery twin 4 directly. For example, a portion of the current that passes through the battery system 2 is transferred to the battery twin 4 directly through the electrical connection of the battery system 2 and the battery twin 4.

In accordance with another embodiment of the present invention, the battery system 2 and the battery twin 4 are located such that ambient working conditions, such as ambient temperature, ambient humidity, and/or vibration, are shared. This feature can be realized, for example, if the battery twin 4 is located close to the battery system 2. For example, the battery twin 4 can be located in the same room where the battery system 2 is functioning.

The system 1 may be used to monitor the battery state of at least one battery cell 3' of the battery system 2 or to monitor the battery state of a plurality battery cells 3' of the battery system 2 or to monitor the battery state of the battery system 2 without interrupting the functioning of the battery system 2.

Further the details of the system 1 for monitoring a battery state without interrupting the functioning of a battery system using a battery twin and how the system 1 works is described together with the description of the method 100 for monitoring a battery state without interruption of functioning of a battery system using a battery twin.

Hereinafter "online measuring" means that the measurements of parameters are fulfilled for the battery system 2 and/or for the at least one battery cell 3, 3' while the at least one battery cell 3, 3' is connected to the battery system 2 and the battery system 2 is in operating and/or functioning.

Hereinafter "offline measuring" means that the measurements of further parameters are fulfilled for the battery twin 4 while the battery system 2 is in operating and/or functioning. And such offline measurements do not affect the functioning the battery system 2.

Figure 2:
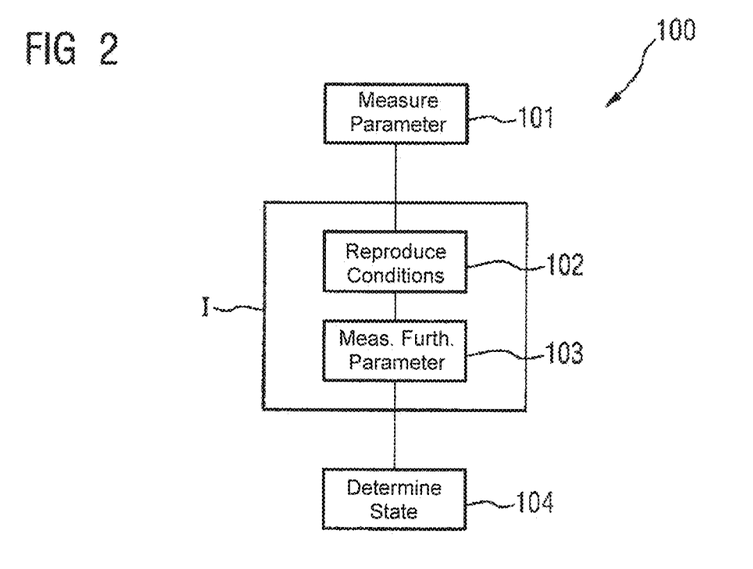
FIG. 2 schematically illustrates a method for monitoring a battery state without interrupting the functioning of a battery system using a battery twin in accordance with the present invention.

FIG. 2 shows a block diagram of a method 100 for monitoring a battery state without interrupting the functioning of a battery system 2 using a battery twin 4.

As described above, the battery system 2 comprises a plurality of battery cells 3, 3' connected to each other. The plurality of the battery cells 3, 3' of the battery system 2 can be in series and/or in parallel circuits. The battery twin 4 comprises at least one battery twin cell 5 that is identical to at least one battery cell of the battery cells 3, 3' of the battery system 2.

At a step 101, at least one parameter of the at least one battery cell 3' of the battery system 2 is measured, where the measured at least one parameter describes working conditions of the at least one battery cell 3' and/or working conditions of the whole battery system 2.

Such measurements of the at least one parameter can be performed with respect to the at least one battery cell 3', a plurality of battery cells 3' and/or with respect to the battery system 2. In addition, it makes sense to measure some parameter (current, voltage, or battery cell temperature) of the at least one battery cell 3' and some parameters (current, voltage, ambient temperature, or vibration) of the battery system 2.

The at least one parameter can be, for example, current, voltage, temperature of the at least one battery cell 3' and/or of the entire battery system 2. In addition, it can be a parameter that describes an ambient environment in which the at least one battery cell 3' and/or the battery system 2 operates such as ambient temperature, humidity, pressure, or vibration. In fact, the more parameters that describe the working conditions of the battery cell 3' and/or the state of the battery system 2 in whole are measured, the better. The working conditions influence the state of the each of the battery cells 3, 3' and, therefore, the state of the battery system 2 in whole. Additionally, it can be parameters that describe the charging/discharging process (how many charging/discharging cycles, or the depth of the charging/discharging).

Such measurements of the at least one parameter of the at least one battery cell 3' can be performed by the measurement device 6.

The method 100 further comprises an offline measurement part I, where the offline measurement part I of the method 100 comprises the following.

At a step 102, the working conditions described with the measured at least one parameter is reproduced on the battery twin 4 such that the at least one parameter of the battery twin 4 under the reproduced working conditions is equal to the measured at least one parameter of the at least one battery cell 3' of the battery system 2. In other words, the battery twin 4 should be brought to the identical working conditions as the at least one battery cell 3' of the battery system 2.

Further, at a step 103 of the offline measurement part I, at least one further parameter of the battery twin 4 while the battery twin 4 is working under the reproduced working conditions is measured.

The measurements of the at least one further parameter of the battery twin 4 are performed without interrupting the functioning of the battery system 2. Still, the battery twin 4 is in the same working conditions as the at least one battery cell 3' and/or the battery system 2 because the working conditions the at least one battery cell 3' and/or the battery system 2 work are measured and further reproduced for the battery twin 4.

Such measurements can be performed by a further measurement device 7. Typically, such further measurement devices 7 are very sophisticated and used in laboratories for precise measurements. Different types of further parameters of the battery twin 4 can be measured offline. Such further parameters can be, for example, impedance, internal resistance, remaining cycle life, and/or total capacity.

Typically, the following measurement methods are used in laboratories for precise measurement of battery parameters: DC load method, AC conductance (1 kHz-method), electrochemical impedance spectroscopy.

After such offline measurements of the at least one further parameter of the battery twin 4 performed within the offline measurement part I at a step 104 a judgment about a battery state of the at least one battery cell 3' and/or about a battery state of the battery system 2 is made.

Taking into account the knowledge that the battery twin 4 is identical to at least one of the battery cells 3' of the battery system 2, the battery twin 4 is in the same working conditions as the at least one of battery cells 3' of the battery system 2, and that the state of the battery twin 4 can be defined more precisely based on the measured further parameters, the judgement about the battery state of the at least one battery cell 3' can be made. Additionally, the judgement about the battery state of the battery system 2 also can be made. Here, such judgements about the battery state are made without interruption of functioning of the battery system 2.

The battery system 2 and the battery twin 4 can have different locations. For example, the battery system 2 can be in remote site while the battery twin 4 can be located in a laboratory.

Figure 3:
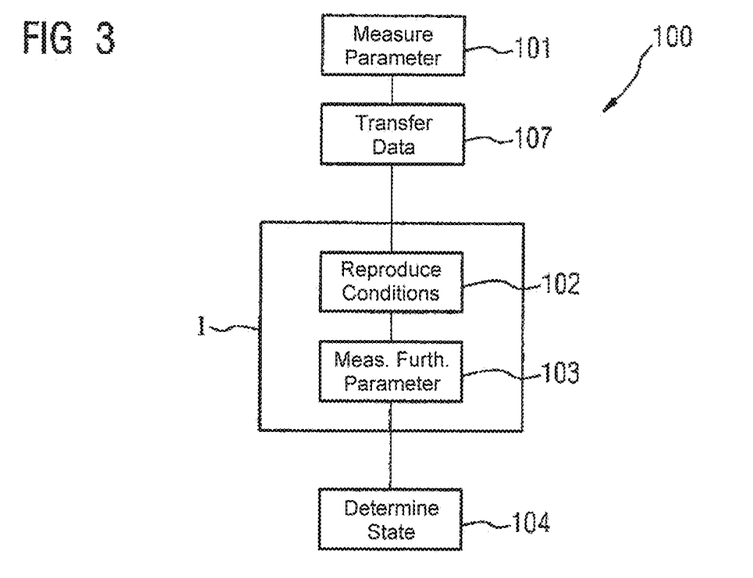
FIG. 3 schematically illustrates an embodiment of the method for monitoring a battery state without interrupting the functioning of a battery system using a battery twin in accordance with the present invention.

Consequently, additionally to the above-described method 100 for monitoring a battery state without interrupting the functioning of a battery system using a battery twin, the method may comprise a step 107 of transferring data that comprise information about the measured at least one parameter to the battery twin 4 to reproduce the working conditions described with the measured at least one parameter on the battery twin 4.

Such data transfer should be performed before starting offline measurement part I and required for the step 102 of reproducing the working conditions described with the measured at least one parameter on the battery twin 4 to bring the battery twin 4 into the identical working conditions as the battery system 2 works.

The data transfer can be performed by different ways.

Figure 4:
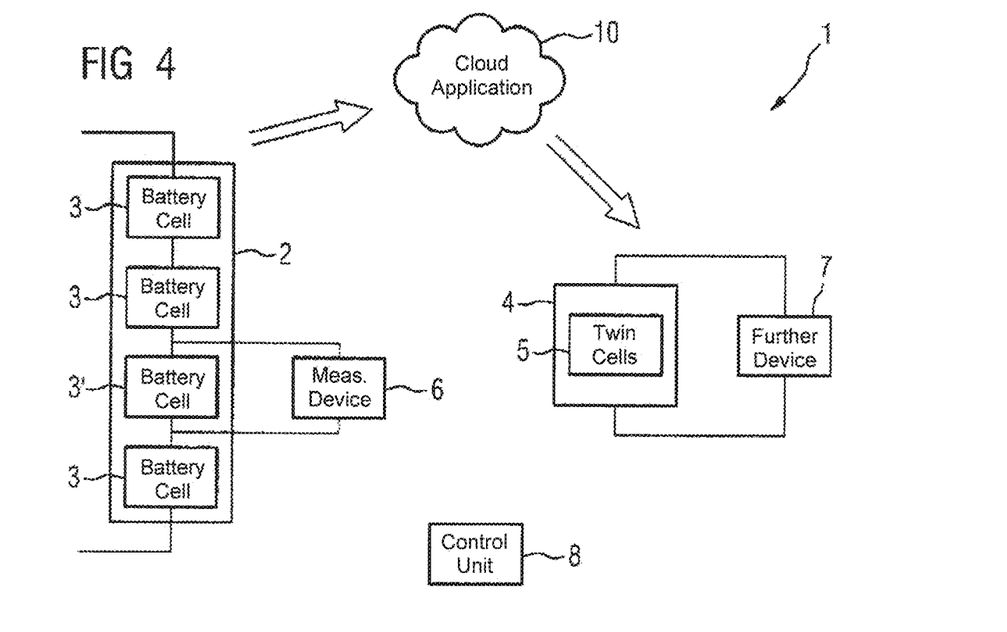
FIG. 4 schematically illustrates an embodiment of the system for monitoring a battery state without interrupting the functioning of a battery system using a battery twin in accordance with the present invention.

In accordance with one embodiment of the present invention, such data transfer is accomplished through a cloud application and/or service 10 as it is shown on FIG. 4.

Figure 5:
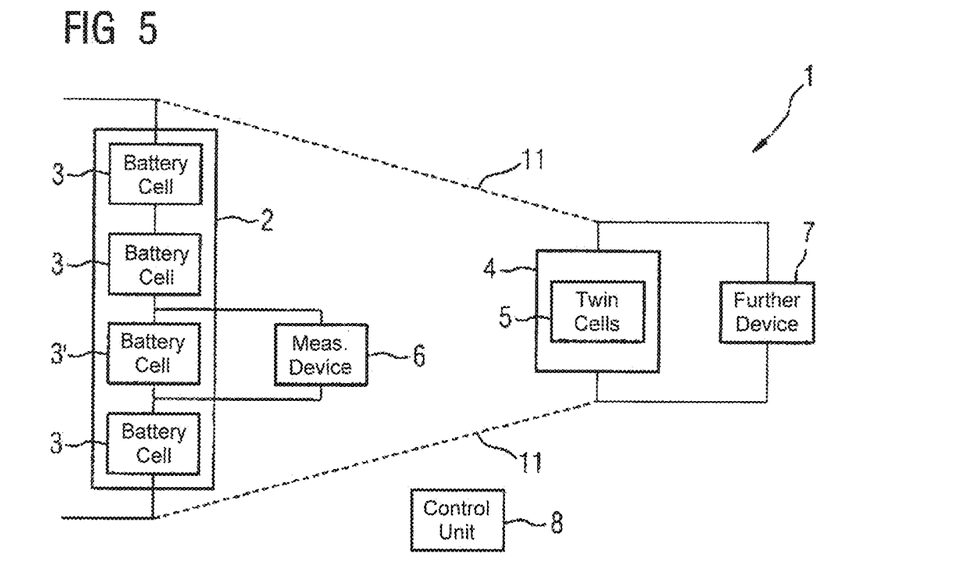
FIG. 5 schematically illustrates another embodiment of the system for monitoring a battery state without interrupting the functioning of a battery system using a battery twin in accordance with the present invention.

Additionally, such data transfer is accomplished through a coupling bypass that is schematically shown on FIG. 5. Such coupling bypass is required for coupling, such as electrically, the battery system 2 and the battery twin 4 such an analogous signal is transferred from the battery system 2 to the battery twin 4 directly. For example, a portion of the current that goes through the battery system 2 is transferred to the battery twin 4 directly through the electrical connection of the battery system 2 and the battery twin 4.

What portion of the current should go to the battery twin 4 should be defined by experts. However, taking such a portion of the current away from the battery system 2 should not affect the functioning of the battery system 2. The portion of the current is rather small and, therefore, the current going through the battery twin 4 won't be identical to the current that goes through the battery system 2. Accordingly, some additional equipment (not shown on FIG. 5), such as an amplifier, can be required to reproduce the working conditions on the battery twin 4. On the other hand, such a data transfer that comprise an information about the measured at least one parameter to the battery twin 4 through the coupling bypass will allow an almost identical replication of the profile of the current to be obtained.

Figure 6:
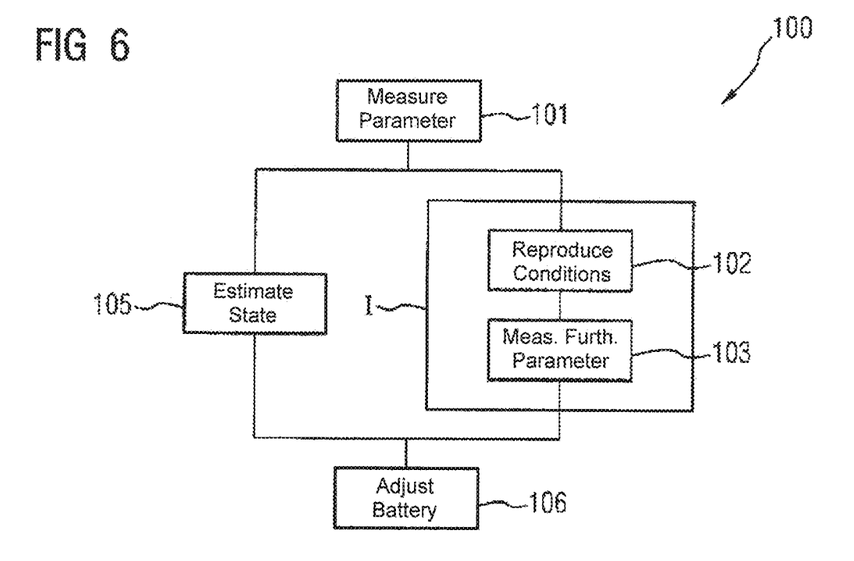
FIG. 6 schematically illustrates another embodiment of the method for monitoring a battery state without interrupting the functioning of a battery system using a battery twin in accordance with the present invention.

In accordance with an embodiment of the method 100 in accordance with the present invention shown in FIG. 6, the method 100 comprises a step 105 to estimate an actual battery state based on the at least one measured parameter of the at least one of the battery cells 3' and/or of the battery system 2 that is accomplished within the step 101. Such measurements of the at least parameter is accomplished without interrupting the functioning of the battery system 2. In other words, this constitutes online measurements of the at least one parameter. Also, such measurements within the step 101 can be performed in online mode that means on a permanent basis. Based on the at least one parameter measured online, the actual battery state of the at least one battery cell 3' and/or the battery system 2 can be estimated and monitored. However, such an estimated actual battery state is not precise because of the nature of measurements that are available in the online regime without interrupting the functioning of the battery system 2.

On the other hand, in accordance with the method 100, the offline measurement part I of the at least one further parameter of the battery twin 4 is accomplished within a specific time interval while the battery twin 4 is in reproduced working conditions. The data that comprise information about the measured at least one parameter sent to the battery twin 4 to reproduce the working conditions described with the measured at least one parameter on the battery twin 4 can be transferred to the battery twin 4 within the step 107 as shown on FIG. 7.

Figure 7:
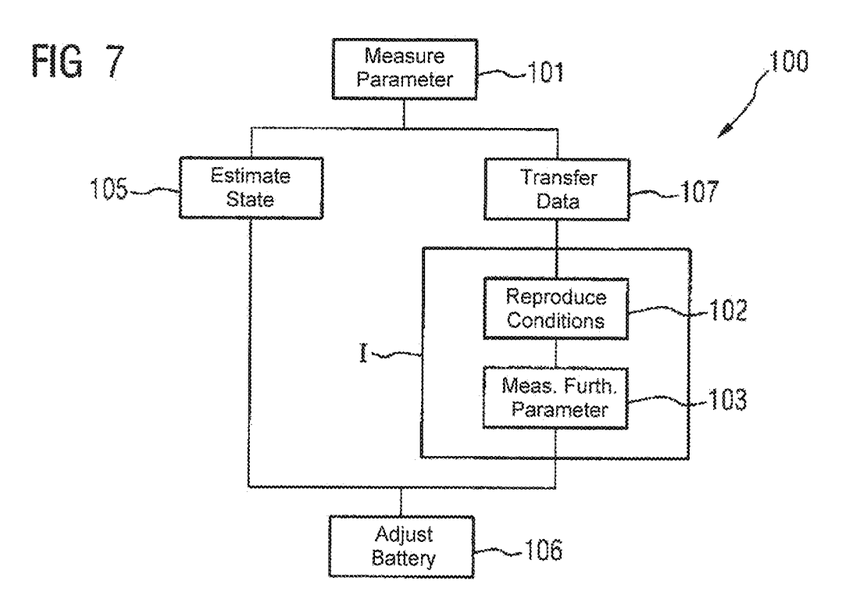
FIG. 7 schematically illustrates another embodiment of the method for monitoring a battery state without interrupting the functioning of a battery system using a battery twin in accordance with the present invention.

Therefore, instead of making a judgement about the battery state based on the measured at least one further parameter of the battery twin 4, at a step 106 the actual battery state is adjusted based on the results of the offline measurements accomplished on the battery twin 4.

Having at least one further parameter for the battery twin 4 measured while the battery twin 4 is in the reproduced working conditions, such as different coefficients that are used for the estimation of the battery state based on online measured parameters can be defined based on the offline measured further parameters.

The specific time interval should be defined by experts and can depend on availability of the battery twin 4 for the offline measurements as well.

It following should also be mentioned. Reproducing the working conditions in which the battery system 2 works into the battery twin 4, and measuring at least one further parameter of the battery twin 4, considering the similarity of the battery twin 4 to the at least one battery cell 3' of the battery system 2 and the similarity of the battery cells 3, 3' to each other within the battery system 2, it is possible to adjust the actual battery state of the at least one battery cell 3' and/or the battery system 2 based on the measured at least one further parameter of the battery twin.

Furthermore, knowing very precisely the behavior of the battery twin 4, and therefore its state, it is possible to estimate the battery state in absolute values in cases, for example, the battery twin 4 from the very beginning always is in the same working conditions as the battery system 2. In the ideal case, the battery system 2 and the battery twin 4 should operate in the same working conditions from the very beginning of their work and permanently over the period of life.

In cases, within some period, the battery twin 4 is in different working conditions in comparison with the battery system 2 (i.e., the battery twin 4 is involved in monitoring of the battery state from time to time), it will be further possible to make judgments and estimation of the battery state of the battery system 2 and/or the at least one battery cell 3' over the battery twin 4 in relative numbers. In other words, it is possible, for example, to estimate how quickly the battery system "gets old", how quickly the state of the health of the battery system decreases, etc.

However, in this case, the battery twin 4 and the measurement equipment 7 can be used for monitoring the battery state without interrupting the functioning of the battery system 2 for a plurality of battery systems 2.

While the present invention has been described in detail with the reference to certain embodiments, it should be appreciated that the present invention is not limited to those precise embodiments. Rather, in view of the present disclosure which describes exemplary modes for practicing the invention, many modifications and variations would present themselves to those skilled in the art without departing from the scope and spirit of this invention. The scope of the invention is, therefore, indicated by the following claims rather than by the foregoing description. All changes, modifications, and variations coming within the meaning and range of equivalency of the claims are to be considered within their scope.

The invention claimed is:

1. A method for monitoring a battery state without interruption of functioning a battery system utilizing a battery twin, the battery system comprising a plurality of battery cells connected to each other, and the battery twin comprising at least one battery twin cell which is identical to at least one battery cell of the battery cells of the battery system, the method comprising:
    measuring at least one parameter of the at least one battery cell of the battery system, the measured at least one parameter describing working conditions of the at least one battery cell and the entire battery system while operating;
    performing an offline measurement part comprising:
    reproducing the working conditions described with the measured at least one parameter on the battery twin such that the at least one parameter of the battery twin under the reproduced working conditions is equal to the measured at least one parameter of the at least one battery cell of the battery system; and
    measuring at least one further parameter of the battery twin while the battery twin is working under the reproduced working conditions;
    making a judgment about the battery state based on the measured at least one further parameter of the battery twin after performing the offline measurement part; and
    adjusting an actual battery state based on the at least one further parameter of the battery twin measured within the offline measurement part.

2. The method of claim 1, wherein the actual battery state is estimated based on the at least one measured parameter; and wherein the offline measurement part is accomplished within a specific time interval.

3. The method of claim 2, wherein between said measuring at least one parameter and the offline measurement part the method comprises:
    transferring data comprising information about the measured at least one parameter to the battery twin to reproduce the working conditions described with the measured at least one parameter on the battery twin.

4. The method of claim 1, wherein between said measuring at least one parameter and the offline measurement part the method comprises:
    transferring data comprising information about the measured at least one parameter to the battery twin to reproduce the working conditions described with the measured at least one parameter on the battery twin.

5. The method of claim 4, wherein said transferring data comprising the information about the measured at least one parameter to the battery twin is implemented via a cloud application.

6. The method of claim 4, wherein at the step of transferring data that comprise an information about the measured at least one parameter to the battery twin, such data transfer is accomplished through a coupling bypass.

7. The method of claim 1, wherein the battery twin is fully identical to the battery system.

8. A system for monitoring a battery state without interruption of functioning a battery system utilizing a battery twin, the battery system comprising a plurality of interconnected battery cells, the system comprising:
    at least one battery twin comprising at least one battery twin cell which is identical to at least one battery cell of the battery cells of the battery system;
    a measurement device which measures at least one parameter of the at least one battery cell of the battery system without interruption of functioning of the battery system, said at least one parameter describing working conditions of the battery system;

a further measurement device which measures at least one further parameter of the battery twin, the at least one further parameter describing a state of the at least one battery twin;

a controller which implements a method for monitoring a battery state without interruption of functioning a battery system utilizing the battery twin;

wherein the method comprises:

measuring at least one parameter of the at least one battery cell of the battery system, the measured at least one parameter describing working conditions of the at least one battery cell and the entire battery system while operating;

performing an offline measurement part comprising:

reproducing the working conditions described with the measured at least one parameter on the battery twin such that the at least one parameter of the battery twin under the reproduced working conditions is equal to the measured at least one parameter of the at least one battery cell of the battery system; and measuring at least one further parameter of the battery twin while the battery twin is working under the reproduced working conditions;

making a judgment about the battery state based on the measured at least one further parameter of the battery twin after performing the offline measurement part; and adjusting an actual battery state based on the at least one further parameter of the battery twin measured within the offline measurement part.

9. The system of claim 8, wherein the battery system and the battery twin are electrically coupled to each other such that analogous signals are directly transferred from the battery system to the battery twin.

10. The system of claim 9, wherein the battery system and the battery twin are located such that ambient working conditions are shared.

11. The system of claim 8, wherein the battery system and the battery twin are located such that ambient working conditions are shared.

* * * * *